(12) United States Patent
Klippel

(10) Patent No.: US 9,166,610 B2
(45) Date of Patent: Oct. 20, 2015

(54) CONVERTER ARRANGEMENT AND METHOD FOR CONVERTING AN ANALOGUE INPUT SIGNAL INTO A DIGITAL OUTPUT SIGNAL

(71) Applicant: Wolfgang Klippel, Dresden (DE)

(72) Inventor: Wolfgang Klippel, Dresden (DE)

( * ) Notice: Subject to any disclaimer, the term of this patent is extended or adjusted under 35 U.S.C. 154(b) by 0 days.

(21) Appl. No.: 14/577,604

(22) Filed: Dec. 19, 2014

(65) Prior Publication Data

US 2015/0180495 A1    Jun. 25, 2015

(30) Foreign Application Priority Data

Dec. 19, 2013 (DE) .......................... 10 2013 021 599

(51) Int. Cl.
*H03M 1/10* (2006.01)
*H03M 1/06* (2006.01)
(Continued)

(52) U.S. Cl.
CPC .......... *H03M 1/0626* (2013.01); *H03M 1/0612* (2013.01); *H03M 1/089* (2013.01); *H03M 1/1038* (2013.01); *H03M 1/46* (2013.01); *H03M 1/12* (2013.01); *H03M 1/66* (2013.01)

(58) Field of Classification Search
CPC ....... H03M 1/12; H03M 1/1038; H03M 1/06; H03M 1/1004; H03M 1/0678; H03M 1/1009; H03M 1/1057; H03M 2201/14; H03M 2201/20; H03M 3/384; H03M 3/458; H03M 1/0607; H03M 1/0639; H03M 1/0641
USPC .................................. 341/118–121, 138, 155
See application file for complete search history.

(56) References Cited

U.S. PATENT DOCUMENTS 5,257,026 A * 10/1993 Thompson et al. ............ 341/118
6,154,572 A * 11/2000 Chaddha ........................ 382/253
(Continued)

OTHER PUBLICATIONS

Boyd, Steven et al., "Measuring Volterra Kernels", IEEE Transactions on Circuits and Systems, vol. CAS-30, No. 8, Aug. 1983, 0098-4094/83/0800-0571$01.00, 1983 IEEE, 7 pages.
(Continued)

*Primary Examiner* — Linh Nguyen
(74) *Attorney, Agent, or Firm* — Westman, Champlin & Koehler, P.A.

(57) ABSTRACT

The invention relates to an arrangement and a method for the identification of parameters in a nonlinear model of an analog-to-digital converter (ADC 17) and the use of this information to reduce the nonlinear distortions of the ADC. A parameter estimator determines an AD parameter vector $P_{AD}$ which describes the nonlinearities of the ADC (17). According to the invention the ADC is excited by a perturbed input signal $y'_A$ generated by adder 77 which combines the analog input signal $y_A$ with perturbation signal $s_1$ provided by generator. The nonlinear system identification uses intermodulation distortion generated in the digital ADC output signal $y'_D$ which are not found in the analog input signal $y_A$. A nonlinear AD compensation element compensates based on parameter vector $P_{AD}$ the nonlinear distortion generated by the ADC and generates the linearized output signal $y_D$. Digital control information $P_{P,1}$ are used to generate the perturbation signal $s_1$ in generator and to remove the perturbation signal the compensation element. The linearized ADC (is the basis for linearizing digital-analog-converters (DAC), amplifiers and other hardware components.

18 Claims, 9 Drawing Sheets

(51) Int. Cl.
*H03M 1/08* (2006.01)
*H03M 1/46* (2006.01)
*H03M 1/12* (2006.01)
*H03M 1/66* (2006.01)

(56) References Cited

U.S. PATENT DOCUMENTS

| | | | |
|---|---|---|---|
| 6,229,467 | B1 | 5/2001 | Eklund et al. |
| 6,271,781 | B1 | 8/2001 | Pellon |
| 6,445,319 | B1 | 9/2002 | Bugeja |
| 7,129,879 | B1 | 10/2006 | Glibbery |
| 7,602,323 | B2 * | 10/2009 | Galton et al. ............ 341/118 |
| 7,773,009 | B2 * | 8/2010 | Rychen ............ 341/120 |
| 8,410,960 | B2 | 4/2013 | Hekstra et al. |
| 8,816,886 | B1 * | 8/2014 | Warner et al. ............ 341/120 |
| 2002/0093439 | A1 * | 7/2002 | Lundin et al. ............ 341/120 |
| 2008/0055128 | A1 * | 3/2008 | Baer ............ 341/120 |
| 2010/0283654 | A1 * | 11/2010 | Waheed et al. ............ 341/166 |
| 2012/0326903 | A1 * | 12/2012 | Chung ............ 341/120 |

OTHER PUBLICATIONS

Hummels, Don, "Linearization of ADCS and DACS for All-Digital Wide-Bandwidth Receivers", IMEKO TC-4 Symposium on Development in Digital Measuring Instrumentation and 4th Workshop on ADC Modeling and Testing Sep. 9-10, 1999—Bordeaux, France, 8 pages.

Yang, Yang et al.., "Linearization of ADCs via Digital Post Processing", 978-1-4244-9474-3/11/$26.00 (C)2011 IEEE, 4 pages.

* cited by examiner

CONVERTER ARRANGEMENT AND METHOD FOR CONVERTING AN ANALOGUE INPUT SIGNAL INTO A DIGITAL OUTPUT SIGNAL

CROSS-REFERENCE TO RELATED APPLICATIONS

This application is a non-provisional application of German Application No. 10 2013 021 599.4, filed Dec. 19, 2013 in German, the contents of which are hereby incorporated by reference in their entirety.

FIELD OF THE INVENTION

The invention relates to a converter arrangement and a method for the identification of parameters in a nonlinear model of an analog-to-digital converter (ADC) and the use of this information to reduce the nonlinear distortions of this ADC. The linearized ADC forms the basis for the linearization of a digital-to-analog converter (DAC) and the design of linear transfer systems and measuring devices.

BACKGROUND OF THE INVENTION

ADC and DAC are well known. ADC and DAC are converters having a nonlinear transfer characteristic that produce harmonics, intermodulation and other nonlinear distortion components in the output signal. This nonlinear distortion can be compensated by a pre-processing of the digital input signal $x_D$ supplied to the DAC or by a post-processing of the digital output signal $y_D$ generated by the ADC.

K. Hariharan compensated static errors of an ADC by using a simple polynomial approach and an optimal estimation of parameters in the publication "A Method for ADC Error Testing and its Compensation in Ratiometric Measurements", Measurement Science Review, Volume 10, no. 2, 2010.

J. Eklund corrected also static errors in the output signal of an ADC in U.S. Pat. No. 6,229,467 by comparing a measured histogram with an expected histogram. H. Hekstra used an iterative method in U.S. Pat. No. 8,410,960 to reduce the spectral flatness in the corrected output signal of the ADC. L. Pellon described in U.S. Pat. No. 6,271,781 a dynamic error calibration, which requires a high-quality generator. A. Bugeja revealed in U.S. Pat. No. 6,445,319 a compensation technique that captures exclusively static nonlinearities in the transfer function between an instantaneous analog input value $V_{in}$ and an digital output value $V_{out}$. A. Glibbery describes a method for detecting static bit errors of an ADC in U.S. Pat. No. 7,129,879.

D. Hummel developed a dynamic compensation method in "Performance Improvement of All-digital Wide Bandwidth Receiver by Linearization of ADC and DAC", Measurement 31 (2002), 35-45 Elsevier, to improve the spurious-free dynamic range (SFDR), that describes the difference in dB between the amplitude of a sine-wave test signal and the largest amplitude nonlinear distortion components in the analog output signal. This approach is limited to distortions, which are generated by the slew rate in the sample and hold circuitry of the ADC.

Y. Yang, identified in "Linearization of ADC via Digital Post Processing', in proceeding of ISCAS May 15-19, Rio de Janeiro, 2011, pp. 989-992, the n-dimensional transfer function of a Volterra model by using a Vandermonde matrix and the frequency-selection method of S. Boyd, et. all. in "Measuring Volterra Kernels," IEEE Trans. Circuits systems, vol. 30 No. 8, pp. 571-577, August 1983.

K. Shi used a Volterra approach for modeling of nonlinear transfer behavior of AD converter in "Blind Volterra system Linearization with Applications to Post Compensation of ADC Nonlinearities" in 2012 IEEE, ICASSP, S. 3581-3584. This procedure requires that the signal is band-limited, and there is a free spectral range for the analysis of the distortion generated by the ADC.

SUMMARY OF THE INVENTION

The objective of the invention is the compensation of nonlinear distortion generated by an ADC by appropriate processing of the ADC output signal $y'_D$ and the generation of a linearized digital output signal $y_D$. Sufficient reduction of distortions shall be achieved for any analog input signal $y_A$. No restrictive assumptions are made on the principle, the structure and the properties of the ADC. Furthermore, there is no prior knowledge about the physical cause of the distortion generated in the signal required.

The invention uses nonlinear system identification to estimate an ADC parameter vector $P_{AD}$, which provides information about a nonlinear ADC model. The ADC parameter vector $P_{AD}$ are largely independent of the analog input signal $y_A$ and need to be updated only if the ADC has time-variant properties changing for example by ambient temperature or other external influences. The nonlinear system identification uses the distorted ADC output signal $y'_D$ or the linearized digital output signal $y_D$. The full identification of the nonlinear ADC model can be skipped if a test tone or a multi-tone complex is used as analog input signal $y_A$. In this case, only selected parameters are identified, which are needed for the compensation of distortion generated by the particular stimulus. This simplifies and speeds up the identification process and improves the robustness of the overall system.

According to the invention, the nonlinear system identification uses a first perturbation signal $s_1$, which is generated by using digital control information $P_{P,1}$. The first perturbation signal $s_1$ is incoherent to the analog input signal $y_A$. The first perturbation signal $s_1$ is added to the analog input signal $y_A$ generating a perturbed input signal $y'_A$, which is converted into the digital ADC output signal $y'_D$.

The generation of perturbed input signal $y'_A$ can be realized by using a DAC and other analog components, where an inherent nonlinearity may generate additional an DAC distortions $n_{DA,1}$, which are also supplied to the input of the ADC. However, the nonlinear DAC distortions $n_{DA,1}$ and the ADC distortion $n_{AD}$ generated by the DAC and ADC, respectively, have different properties. Only the nonlinear ADC distortions $n_{AD}$ contain intermodulation products of the analog input signal $y_A$ and the first perturbation signal $s_1$ generated by the nonlinearities of the ADC. These intermodulation products are not included in the DAC distortions $n_{DA,1}$ of the DAC as long as the first perturbation signal $s_1$ is incoherent with the analog input signal $y_A$. This important condition can be fulfilled by using the properties of the analog input signal $y_A$ in the generation of the first perturbation signal $s_1$ and in the following parameter identification. If the properties of the stimulus are not known, an additional measurement of the analog input signal $y_A$ or of the ADC output signal $y'_D$ is required.

The spectral properties of the first perturbation signal $s_1$, i.e. the amplitude and phase of its spectral components can be changed by the digital control information $P_{P,1}$. This ensures the incoherence between perturbation signal $s_1$ and the analog input signal $y_A$ and allows determining the ADC parameter vector $P_{AD}$.

The first perturbation signal $s_1$, which is required for the nonlinear identification of the ADC parameter vector $P_{AD}$ passes the ADC and appears as an additional signal component in the ADC output signal $y'_D$. This signal component can also be compensated in an AD compensation element by using the first control information $P_{P,1}$ describing the properties of the perturbation signal $s_1$.

Another feature of the invention is that the ADC parameter vector $P_{AD}$ is determined exclusively by the intermodulation between the first perturbation signal $s_1$ and the analog input signal $y_A$. The intermodulation can only be generated in the signal path after the superposition of the perturbation signal $s_1$ and the analog input signal $y_A$. Thus all analog hardware components may be nonlinear and generate harmonics and other nonlinear distortions of one of the two signals which will not affect the identification of the ADC parameter vector $P_{AD}$ due to the incoherence between the analog input signal $y_A$ and perturbation signal $s_1$. Thus the linearization of the ADC dispenses with the identification of the nonlinearity inherent in the first analog source and the compensation of the nonlinear distortion in the perturbation signal $s_1$.

The invention can also be used for the linearization of DACs. After compensating the distortion generated by the ADC, the linearized ADC is used for the acquisition of an analog DAC output signal $x'_A$. The ADC output signal $y'_D$ contains nonlinear distortion generated by the nonlinearities inherent in the DAC. These distortions are the basis for estimating a DAC parameter vector $P_{DA}$, which describes the generation of nonlinear distortion by the DAC nonlinearities. The identified DAC parameter vector $P_{DA}$ is used to generate a DAC input signal $x'_D$ comprising the digital input signal $x_D$ and a synthesized DAC compensation signal $c_{DA}$ that compensates for the distortion $n_{DA,0}$ generated in the following DAC.

The invention can also be used for linearizing a measuring chain comprising a digital waveform generator, a linearized DAC, a device under test (DUT), a linearized ADC and a signal analyzer. To separate the distortions generated by DAC from the distortions generated by the DUT, a second perturbation signal $s_2$ is added to the DAC output signal $x'_A$. The second perturbation signal $s_2$ shall also be incoherent to both the digital input signal $x_D$ of the DAC and to the first perturbation signal $s_1$.

These and other features, benefits and technical feasibility of the present invention are characterized more by the following illustrations, detailed description and claims.

DETAILED DESCRIPTION OF THE INVENTION

Figure 1:
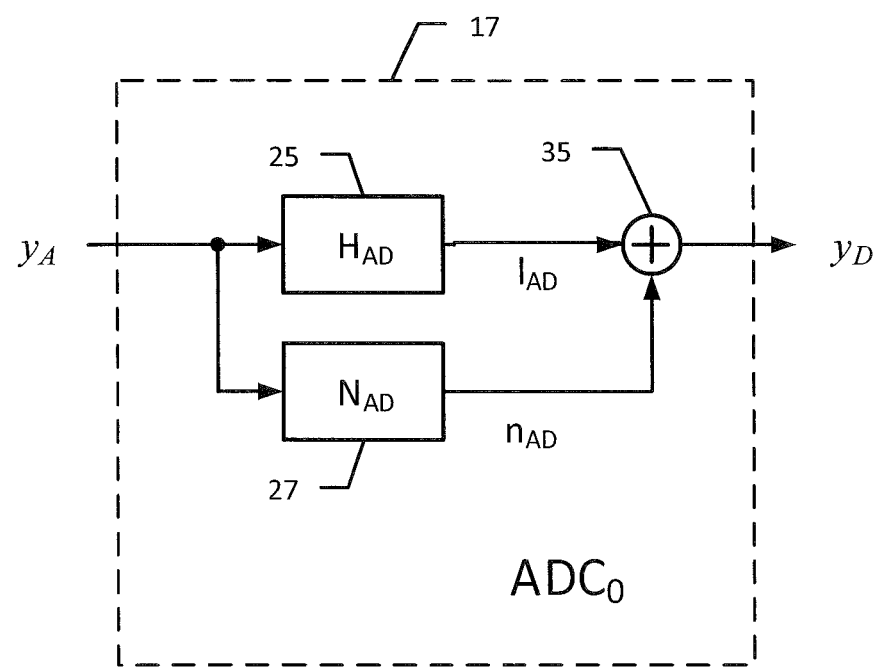
FIG. 1 shows a block diagram for modeling a nonlinear ADC.

FIG. 1 shows a model of the ADC 17, that contains a linear element 25 with the transfer function $H_{AD}(s)$ and a nonlinear element 27, whose inputs are supplied with the analog input signal $y_A$. Their output signals are summed up by adder 35 generating the digital output signal $$y_D = l_{AD} + n_{AD}. \quad (1)$$

The linear signal can be expressed as $$l_{AD} = L^{-1}\{H_{AD}(s)\} * y_A \quad (2)$$

using the convolution operation *, the Laplace operator s and the inverse Laplace transform $L^{-1}\{\ \}$. The nonlinear distortion signal $$n_{AD}(t) = \sum_{k=2}^{K} \int \cdots \int h_{AD}^k(\tau_1, \ldots, \tau_k) y_A(t-\tau_1) \cdots y_A(t-\tau_1) d\tau_1 \cdots d\tau_k \quad (3)$$

is expressed as a truncated Volterra series comprising $k^{th}$-order homogeneous power systems with the kernel function $h_{AD}^k(\tau_1, \ldots, \tau_k)$.

Figure 2:
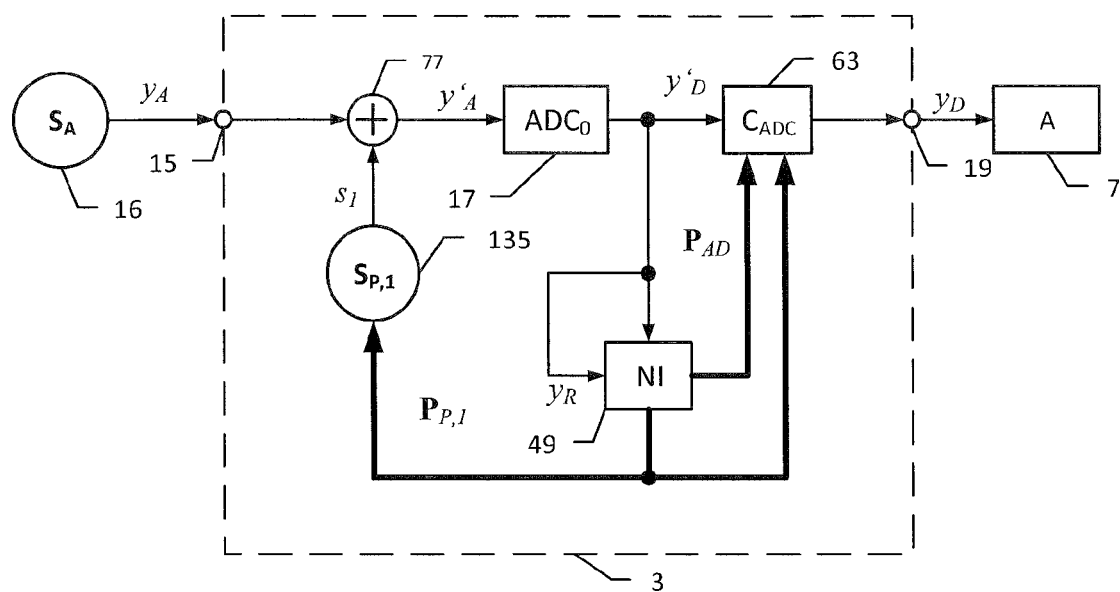
FIG. 2 shows a first arrangement for linearizing the ADC.

FIG. 2 shows the arrangement for the linearization of the ADC 17 according to the invention using a generator 135, which generates a first perturbation signal $s_1$ using digital control information $P_{P,1}$. The perturbation signal $s_1$ is incoherent to the analog input signal $y_A$ yielding a vanishing expectation value $$E\{s_1(t) \cdot y_A(t+\tau)\} = 0 \forall \tau. \quad (4)$$

The analog input signal $y_A$ at input 15 provided by an external signal source 16 is added to the first perturbation signal $s_1$ in the linking device 77 generating a perturbed input signal $y'_A$. The ADC 17 provided with the perturbed input signal $y'_A$ generates an ADC output signal $y'_D$. The AD compensation element 63 compensates for the nonlinear ADC distortions $n_{AD}$ generated by the ADC 17 in accordance with (3) by using the ADC output signal $y'_D$ and an ADC parameter vector $P_{AD}$ provided by a parameter estimator 49. The ADC output signal $y'_D$ is supplied as a reference signal $y_R$ to the parameter estimator 49, in order to ensure the incoherence with the first perturbation signal $s_1$. However, the incoherence between the ADC output signal $y'_D$ and the perturbation signal $s_1$ can only be evaluated if the generation of the perturbation signal $s_1$ in generator 135 has temporarily been disabled by using the digital control information $P_{P,1}$.

Figure 3:
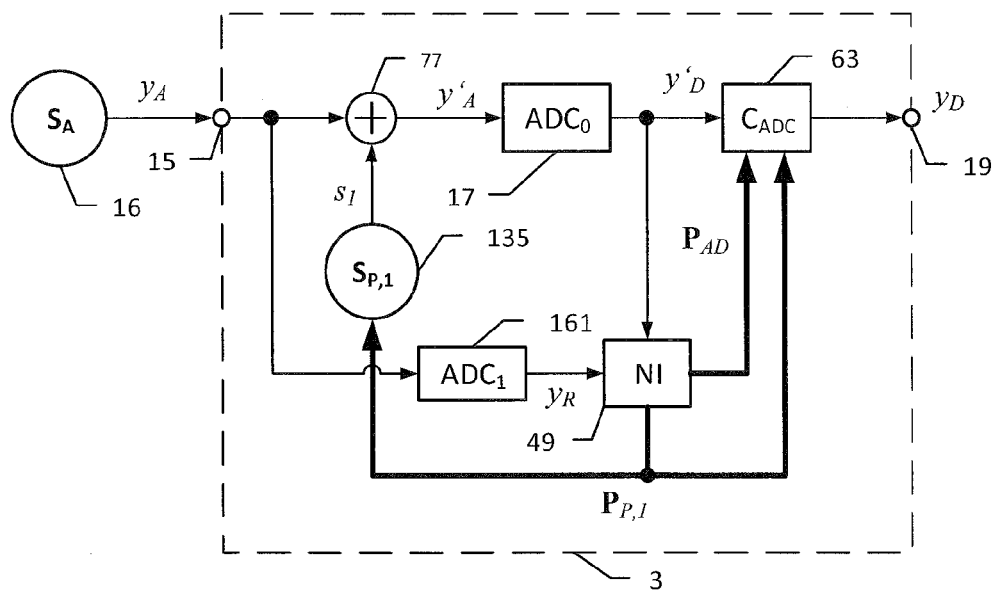
FIG. 3 shows an alternative arrangement for linearizing a first ADC by using a second ADC.

FIG. 3 shows an alternative embodiment of the invention, which uses the analog input signal $y_A$ converted by a second reference ADC 161 as the reference signal $y_R$ in parameter estimator 49. This alternative version is advantageous compared to the simplified solution in FIG. 2 because the incoherence between the first perturbation signal $s_1$ and the analog input signal $y_A$ can be checked at any time for any analog input signal $y_A$.

Figure 4:
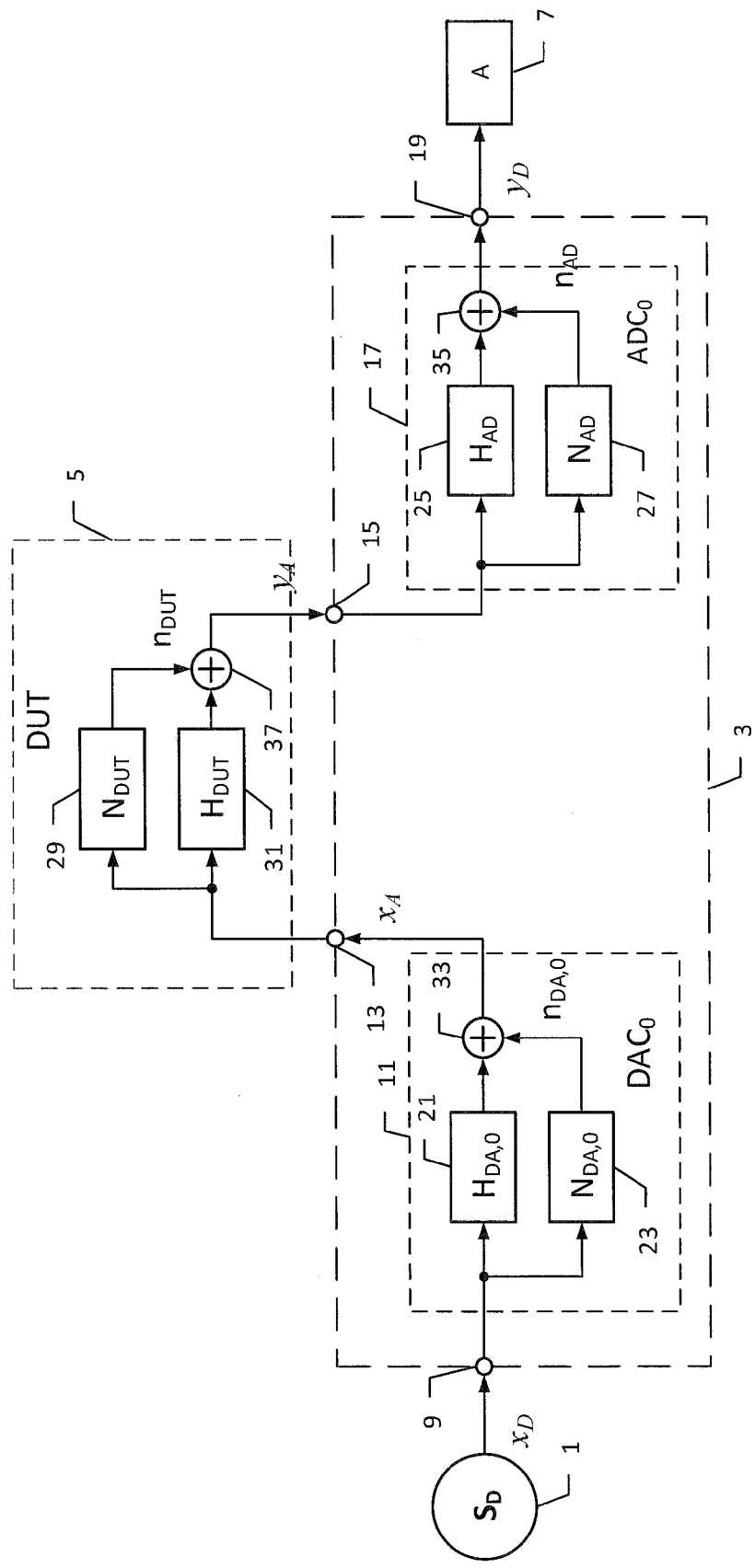
FIG. 4 shows a block diagram for modelling a measuring chain.

FIG. 4 shows a signal flow chart for modeling a measuring chain, comprising a digital signal source 1, a DAC 11, a device under test (DUT) 5, an ADC 17 and a signal analyzer 7. The ADC 17 corresponds to the model in FIG. 1.

The DAC 11 converts a digital input signal $x_D$ provided of the signal source 1 into an analog output signal $x_A$. The transfer behavior of the DAC is modeled by the parallel connection of a linear transfer element 21 and a nonlinear transfer element 23 generating a linear signal and nonlinear distortion $n_{DA,0}$, respectively, which are combined by adder 33 to the analog output signal $x_A$.

The DUT 5 is excited by the analog output signal $x_A$ at the output 13 and generates an analog input signal $y_A$ at the input 15. The transfer behavior is modeled by the parallel connection of a linear transfer element 31, nonlinear transfer element 29, generating nonlinear distortion $n_{DUT}$ which are combined with the linear signal in adder 37.

The linear transfer elements 21 and 31 are described by the transfer functions $H_{DA,0}(s)$ and $H_{DUT}(s)$, respectively. The nonlinear transfer elements 23 and 29 are approximated by the truncated Volterra series $$n_{DA,0}(t) = \sum_{k=2}^{K} \int \ldots \int h_{DA}^k(\tau_1, \ldots, \tau_k) x_D(t-\tau_1) \ldots x_D(t-\tau_1) d\tau_1 \ldots d\tau_k \quad (5)$$

or $$n_{DUT}(t) = \sum_{k=2}^{K} \int \ldots \int h_{DUT}^k(\tau_1, \ldots, \tau_k) x_A(t-\tau_1) \ldots x_A(t-\tau_1) d\tau_1 \ldots d\tau_k. \quad (6)$$

Thus, the digital output signal $y_D$ defined by $$y_D(t) = L^{-1}\{H_{DUT} \cdot H_{DA,0} \cdot H_{AD}\} * x_D + L^{-1}\{H_{DUT} \cdot H_{AD}\} * n_{DA,0} + L^{-1}\{H_{DUT} \cdot H_{AD}\} * n_{DA,0} + L^{-1}\{H_{AD}\} * n_{DUT} + n_{AD} \quad (7)$$

comprises a linear signal part and additional distortion generated by DAC 11, DUT 5 and ADC 17.

Figure 5:
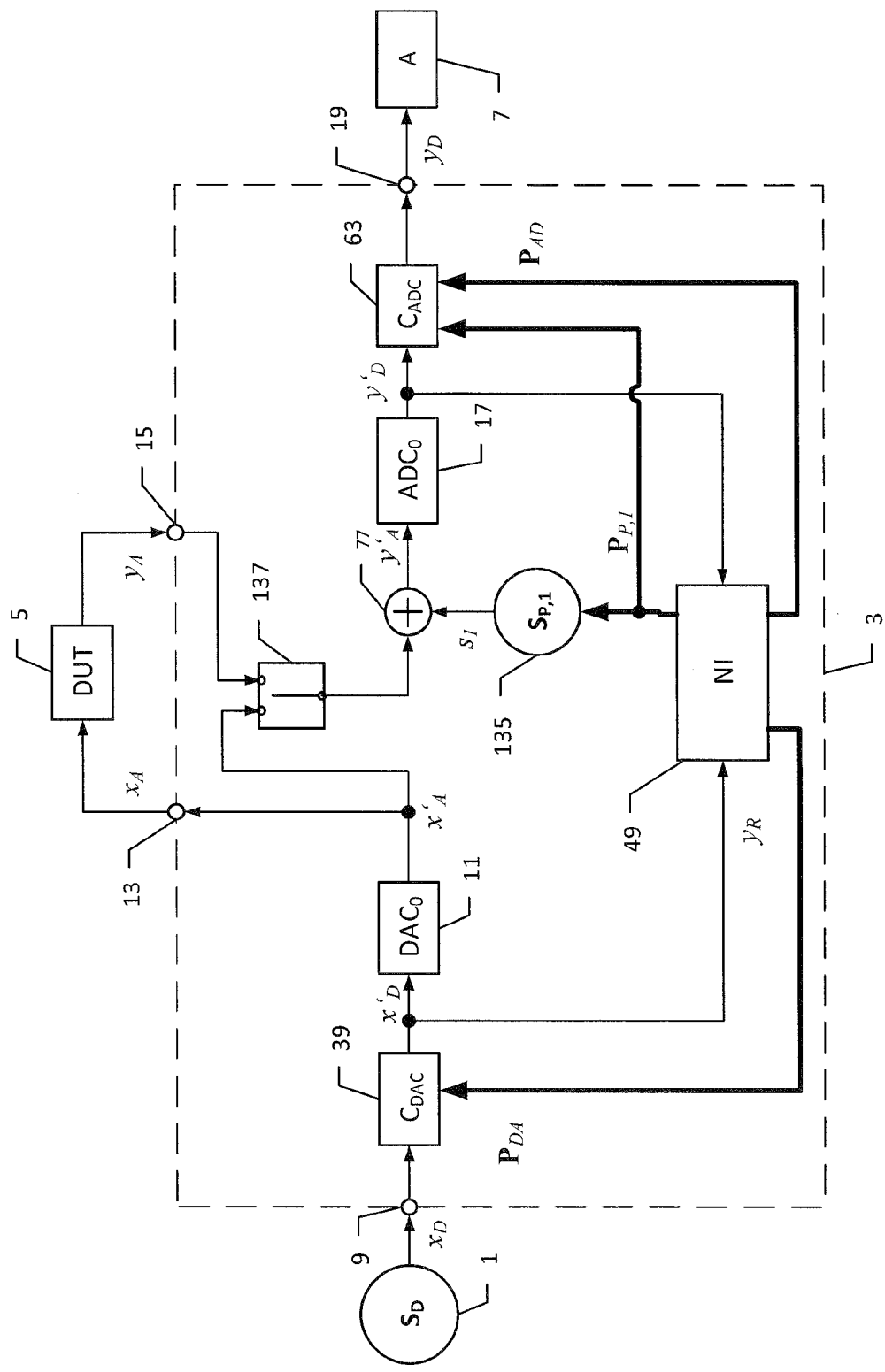
FIG. 5 shows a first embodiment for linearizing a measuring chain by using a switch.

FIG. 5 shows a first embodiment of the invention providing a complete linearization of the measurement chain including DAC 11 and ADC 17. During a special calibration process a switch 137 replaces the DUT 5 by a direct connection between the output of the DAC 11 and the input of the linking device 77. A DA-compensation element 39 generates a DAC input signal $x'_D$ based on the digital input signal $x_D$ and a DAC parameter vector $P_{DA}$, which is transferred to the input of the DAC 11. The DAC parameter vector $P_{DA}$ is generated in the parameter estimator 49 to ensure that the DAC compensation signal $c_{DA}$ synthesized in the DA-compensation element 39 compensates the nonlinear distortion $n_{DA,0}$ of the DAC 11. The digital input signal $x_D$ or DAC input signal $x'_D$ can be used as a reference signal $y_R$ in the parameter estimator 49. After estimating optimum values of the DAC parameter vector $P_{DA}$ the DUT 5 is inserted in the measuring chain by switch 137 and the measurement of the DUT is performed.

Figure 6:
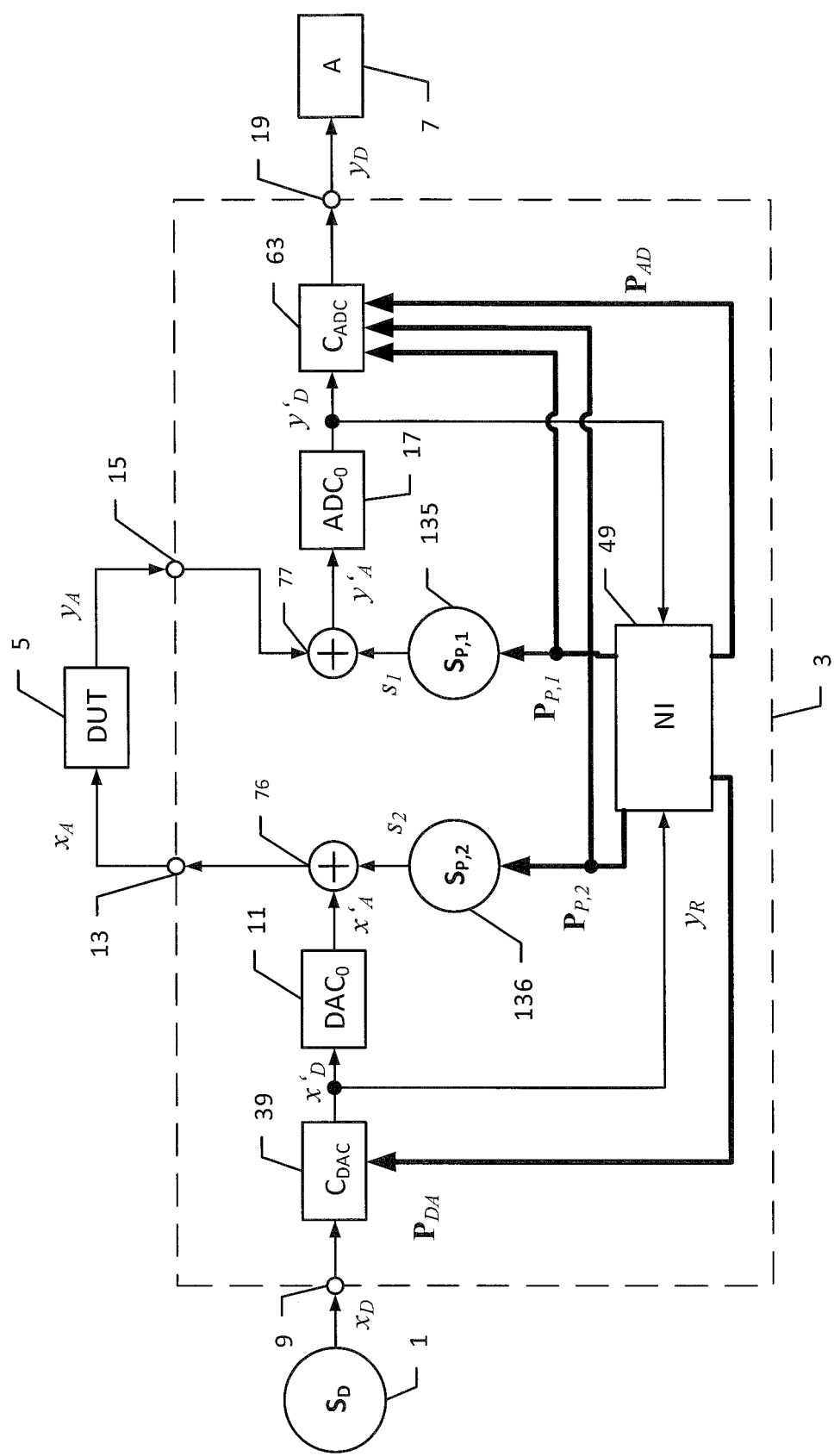
FIG. 6 shows an alternative embodiment for linearizing a measuring chain by using a second perturbation signal.

FIG. 6 shows an alternative embodiment of the linearization of the measuring chain which dispenses with the switch 137 in FIG. 5 and determines the DAC parameter vector $P_{DA}$ while the signal is transferred via DUT 5. According to the invention the analog output signal $x_A$ supplied to the DUT contains a second perturbation signal $s_2$ with the following properties $$E\{s_2(t) \cdot x'_D(t+\tau)\} = 0 \forall \tau$$

$$E\{s_2(t) \cdot s_1(t+\tau)\} = 0 \forall \tau \quad (8)$$

which ensure that the signal $s_2$ is incoherent with both the DAC input signal $x'_D$ and the first perturbation signal $s_1$. A generator 136 generates a second perturbation signal $s_2$ based on second control information $P_{P,2}$ which is added to the DAC output signal $x'_A$ in a second adder 76 generating the analog output signal $x_A$. The control information $P_{P,2}$ generated in the parameter estimator 49 are also supplied to the AD compensation element 63 to remove the second perturbation signal $s_2$ from the digital output signal $y_D$.

Figure 7:
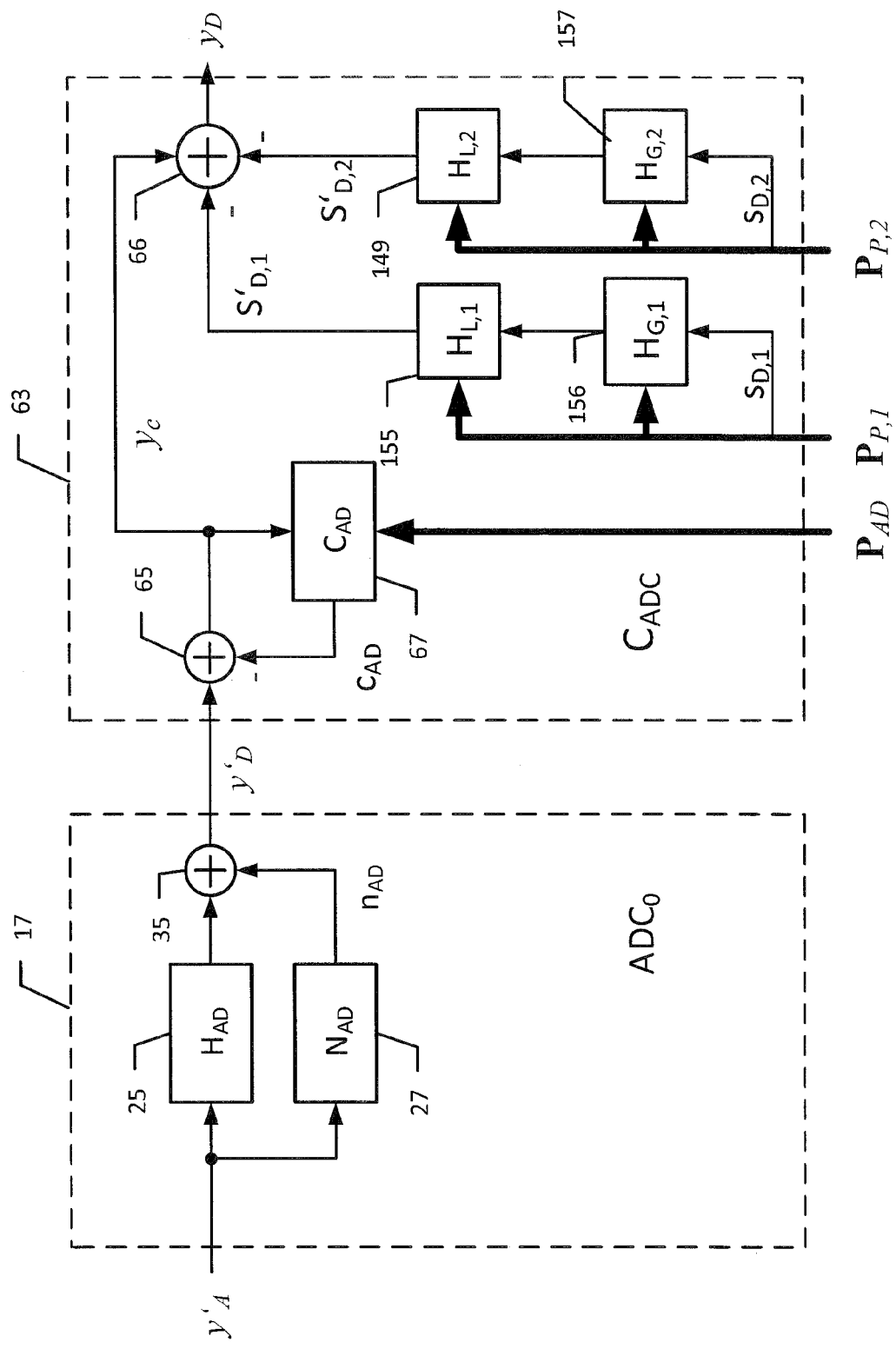
FIG. 7 shows an embodiment of the AD-compensation element.

FIG. 7 shows a model of the ADC 17 and an embodiment of the AD-compensation element 63. The digital output signal $$y_D = L^{-1}\{H_{AD}(s)\} * y'_A + n_{AD} - c_{AD} - s'_{D,1} - s'_{D,2} \quad (9)$$

$$\approx L^{-1}\{H_{AD}(s)\} * y'_A - s'_{D,1} - s'_{D,2}$$

is generated by using the linking devices 35, 65 and 66 based on the perturbed input signal $y'_A$ filtered by a linear system 25 with the transfer function $H_{AD}(s)$, the nonlinear ADC distortions $n_{AD}$ of the nonlinear system of 27, a nonlinear compensation signal $c_{AD}$, which compensates for the nonlinear ADC distortions $n_{AD}$ of the ADC 17 and the compensation signals $s'_{D,1}$ and $s'_{D,2}$ of the first and second perturbation signals.

A linking device 65 generates a linearized output signal $y_c$ by subtracting a nonlinear compensation signal $c_{AD}$ from the linearized output signal $y_c$ of the ADC 17. The nonlinear compensation signal $c_{AD}$ is generated in a nonlinear transfer element 67 on the basis of the linearized output signal $y_c$ at the output of the linking device 65 and the ADC parameter vector $P_{AD}$.

The nonlinear transfer element 67 is realized as a truncated Volterra system $$c_{AD}(t) = \sum_{k=2}^{K} \int \ldots \int h_{AD}^k(\tau_1, \ldots, \tau_k) y'_D(t-\tau_i) \ldots y'_D(t-\tau_1) d\tau_1 \ldots d\tau_k \quad (10)$$

with kth-order kernel function $h_{AD}^k(\tau_1, \ldots, \tau_k)$ which is identical with kernel function in (3) describing the nonlinear element 27.

The first and second compensation signals $s'_{D,1}$ and $s'_{D,2}$ are generated in the linear transfer elements 155, 156 and 149, 157, from the digital perturbation signals $s_{D,1}$ and $s_{D,2}$, respectively. The control information $P_{P,1}$ and $P_{P,2}$ generated in the digital parameter estimator 49 provide the digital perturbation signals $s_{D,1}$ and $s_{D,2}$, the transfer functions $H_{G,1}$, $H_{L,1}$ and $H_{G,2}$, $H_{L,2}$ of the linear transfer elements 155, 156 and 149, 157 respectively.

Figure 8:
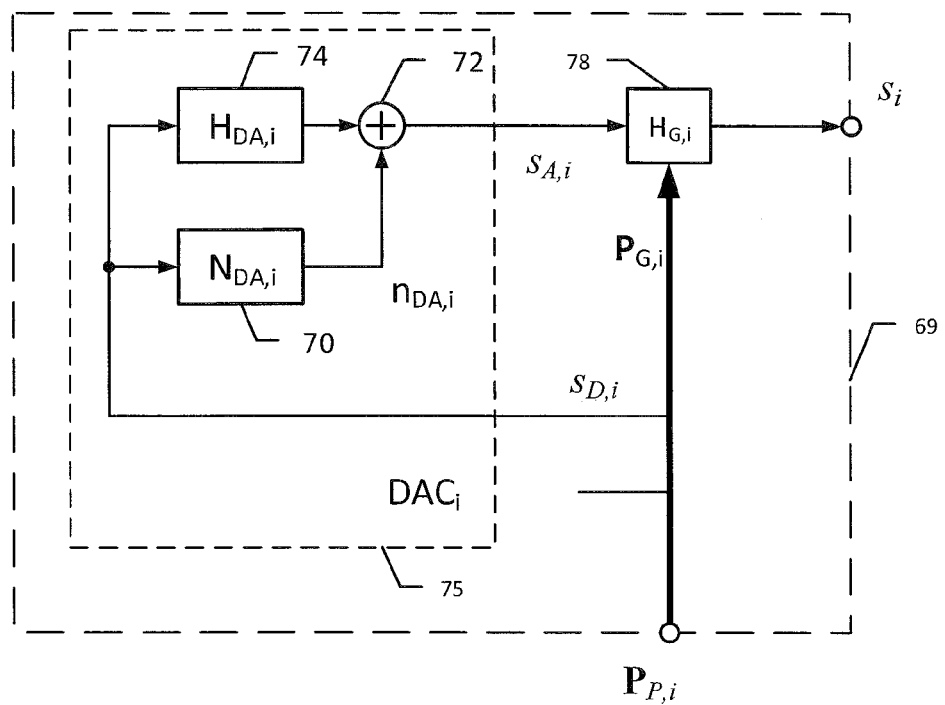
FIG. 8 shows an embodiment of the source of the perturbation signal.

FIG. 8 shows an embodiment of the generator 69, which represents the generators 135 and 136 providing the analog perturbation signals $s_i$ with $i=1, 2$. The digital perturbation signal $sp$, which is a part of the control information $P_{P,i}$ is applied to a DAC 75. The DAC 75 converts the digital perturbation signal $s_{D,i}$ into an analog output signal $s_{A,i}$. The DAC 75 is modeled by the parallel connection of a linear system 74 with the transfer function $H_{DA,i}(S)$, a nonlinear system 70, that produced the nonlinear distortion of $n_{DA,1}$, by using a linking device 72. On the basis of the analog output signal $s_{A,i}$ the linear transfer element 78 generates the perturbation signals $s_i$, wherein the transfer function $H_{G,i}(f)$ of the linear transfer element 78 can be changed by linear parameters $P_{G,i}$ provided in the first control information $P_{P,i}$ with $i=1,2$.

Figure 9:
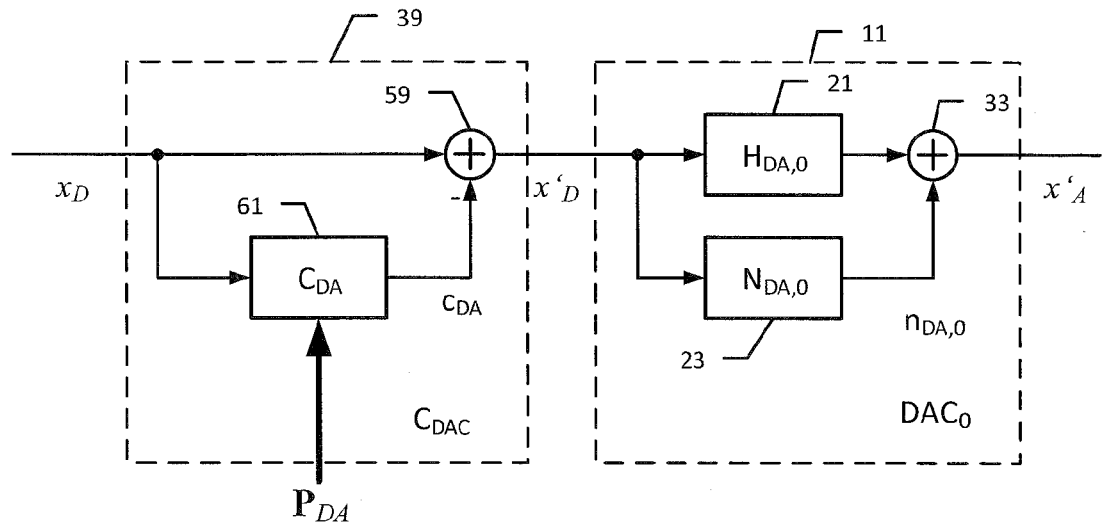
FIG. 9 shows an embodiment of the DA-compensation system.

FIG. 9 shows an embodiment of compensation system 39 in connection with DAC 11, which contains a nonlinear Volterra system 61 generating the nonlinear compensation signal $$c_{DA}(t) = \sum_{k=2}^{K} \int \ldots \int h_{DA}^{k}(\tau_1, \ldots, \tau_k) x_D(t-\tau_1) \ldots x_D(t-\tau_1) d\tau_1 \ldots d\tau_k \quad (11)$$

using the kth-order kernel function $h_{DA}^{k}(\tau_1, \ldots, \tau_k)$ provided in the DAC parameter vector $P_{DA}$ and the digital input signal $x_D$ and a linking device 59, which generates the DAC input signal $x'_D$ by subtracting the DAC compensation signal $c_{as}$ from the digital input signal $x_D$. FIG. 9 shows also a model of the DAC 11 in accordance with FIG. 4, where the nonlinear distortions of both systems are compensated:

$$n_{DA,0} - L^{-1}\{H_{DA,0}(s)\} * c_{DA} \approx 0 \quad (12)$$

Figure 10:
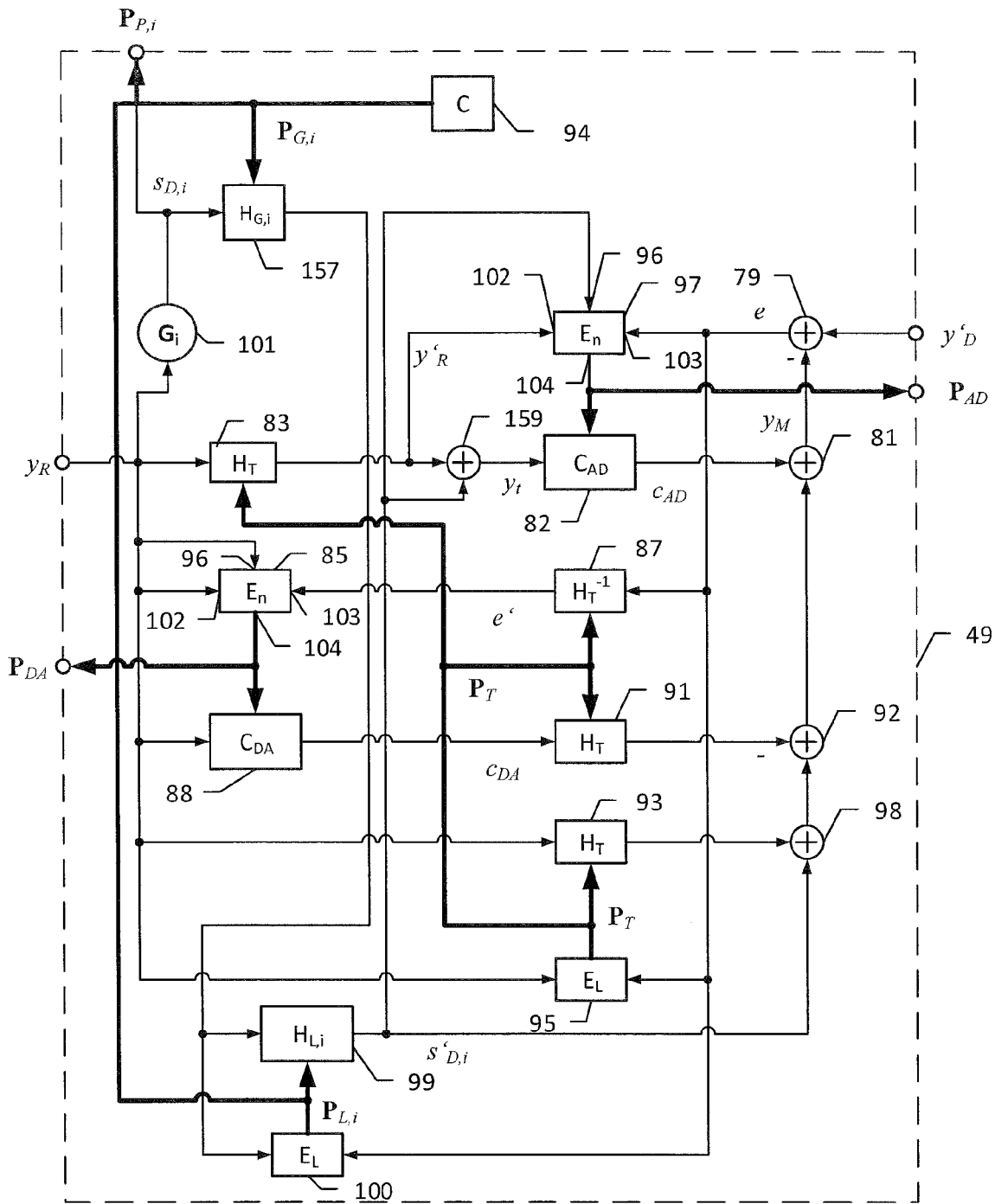
FIG. 10 shows an embodiment of the parameter estimator.

FIG. 10 shows an embodiment of the parameter estimator 49 in accordance with FIG. 5 for generating the control information $P_{P,i}$ with i=1. The embodiment can also be used for the generation of the second control information $P_{P,2}$ in FIG. 6.

The linear system 83 with the transfer function $$H_T(S) = H_{DA,0}(S) H_{AD}(s) \quad (13)$$

generates the filtered reference signal $y'_R$ based on the reference signal $y_R$. The linking device 159 adds the filtered reference signal $y'_R$ to the perturbation compensation signal $s'_{D,1}$ and generates a sum signal $y_t$, which imitates the linearized output signal $y_c$ in the AD-compensation element 63. The nonlinear Volterra-system 82, corresponding to (10) and the nonlinear transfer element 67, generate the nonlinear compensation signal $c_{AD}$ supplied to the non-inverting input of linking device 81.

The nonlinear Volterra system 88, corresponding to (11) and the nonlinear system 61, generate the DAC compensation signal $c_{DA}$ based on the reference signal $y_R$. The linear system 91 with the transfer function $H_T(s)$ in accordance with (13) filters the DAC compensation signal $c_{DA}$ and supplies the output signal to the inverting input of a linking device 92.

The linear system 93 with the transfer function $H_T(s)$ filters the reference signal $y_R$ corresponding to the transfer of the digital input signal $x_D$ from input 9 to output 19. The series connection of the linear systems 157 and 99 with the transfer function $H_{G,i}(s)$ and $H_{L,i}(s)$, respectively, generate the filtered perturbation signals $s'_{D,i}$, which describe the linear transfer of the digital perturbation signals $s_{D,i}$ to the output of the ADC 17 with i=1,2. The linking devices 98, 92, 81 add the output signals of the linear systems 99, 93, 91 and the nonlinear ADC model 82, generating the model output signal $y_M$. The error assessment element 79 generates the error signal e as the difference between ADC output signal $y'_D$ and the model output signal $y_M$.

The parameter estimator 97 generates iteratively the ADC parameter vector $P_{AD}$, comprising the kth-order kernel function of the Volterra-series $$h_{AD}^{k}(\tau_1, \ldots, \tau_k, t+\Delta t) = h_{AD}^{k}(\tau_1, \ldots, \tau_k, t) + \mu g_{AD}^{k}(\tau_1, \ldots, \tau_k, t) e(t) \quad (14)$$

by using a stochastic gradient algorithm (LMS) with the gradient signal $$g_{AD}^{k}(\tau_1, \tau_2, t) = s'_{D,i}(t-\tau_1) \cdot y'_R(t-\tau_1) \quad k=2$$

$$g_{AD}^{k}(\tau_1, \ldots, \tau_k, t) = s'_{D,i}(t-\tau_1) y'_R(t-\tau_2) \ldots y'_R(t-\tau_k) \quad k>2 \quad (15)$$

the error signal e, the filtered reference signal $y'_R$ from the output of the linear system 83, the compensation signal $s'_{D,i}$ and the learning speed parameter µ.

It is an important feature of the invention, that the gradient signal $g_{AD}^{k}(\tau_1, \ldots, \tau_k, t)$ contains at least two signals as factors in the product in (15) which are incoherent. This condition can be met even if the perturbation compensation signal $s'_{D,i}$ occurs several times as a factor in (15). It is essential that the gradient signal $g_{AD}^{k}(\tau_1, \ldots, \tau_k, t)$ comprises at least one cross product of the reference signal $y'_R$ and the noise compensation signal $s'_{D,i}$ generating intermodulation distortion. If the kth-order gradient signal contains products of either the reference signal $y'_R$ or noise compensation signal $s'_{D,i}$, the gradient signal would contain harmonic distortion which would generate a bias in the nonlinear system identification of the DAC 11 and ADC 17. Thus, the harmonic distortion neither in the reference signal $y'_R$ nor in the compensation signal $s'_{D,i}$ are used for the determination of the ADC parameter vector $P_{AD}$ in the parameter estimator 97.

Figure 11:
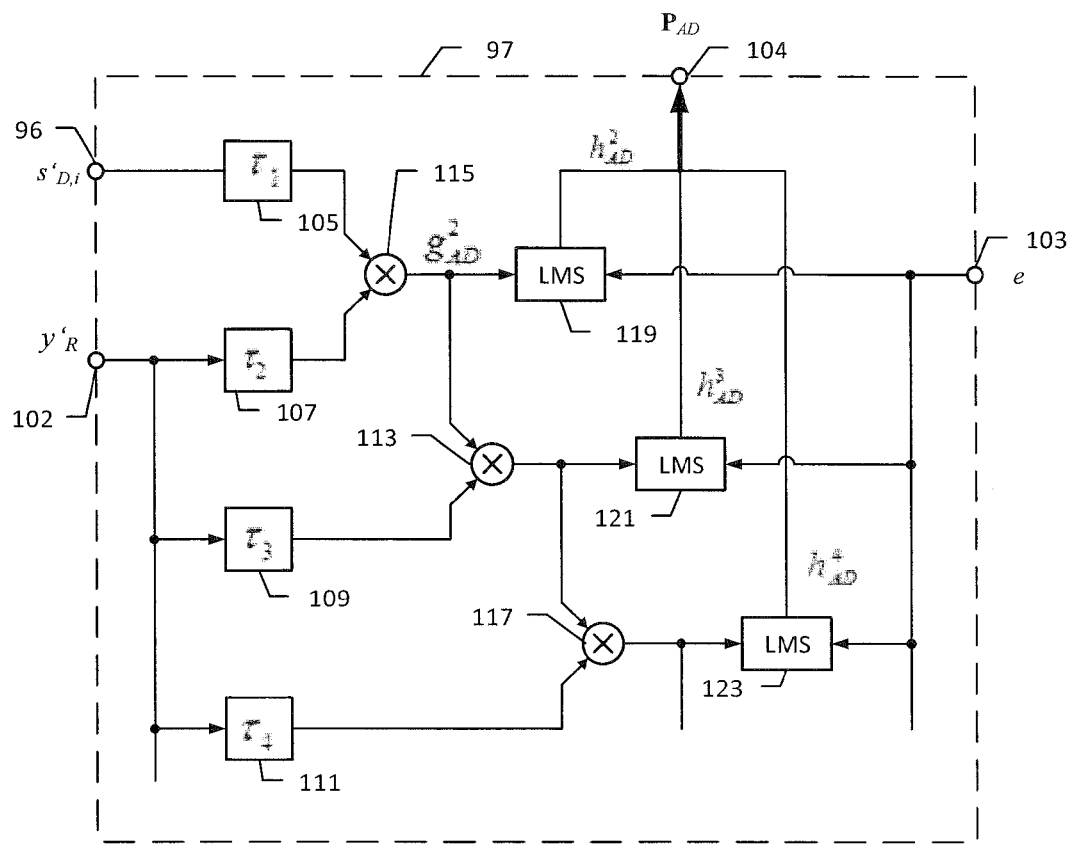
FIG. 11 shows a specific embodiment of a nonlinear coefficient estimator for i=1, 2.

The identification of the DAC parameter vector $P_{DA}$ in DA parameter estimator 85 uses information in the nonlinear distortion which are orthogonal to the information used in the identification of the ADC parameter vector $P_{AD}$ in parameter estimator 97. Although both parameter estimators 85 and 97 are based on the same embodiment as shown in FIG. 11, the estimator 85 is supplied with the reference signal $y_R$ at the inputs 96 and 102 while the parameter estimator 97 is supplied with the incoherent signals $y'_R$ and $s'_{D,i}$ to the corresponding inputs. A linear system 87 having the inverse transfer function $H_T(s)^{-1}$ of the system 91, generates the filtered error signal e' which is fed into the input 103 of the parameter estimator 85. The parameter estimator determines iteratively the kth-order kernel functions in the DAC parameter vector $P_{DA}$ $$h_{DA}^{5}(\tau_1, \ldots, \tau_k, t+\Delta t) = h_{DA}^{k}(\tau_1, \ldots, \tau_k, t) + \mu g_{DA}^{k}(\tau_1, \ldots, \tau_k, t) e'(t) \quad (16)$$

using the gradient signal $$g_{DA}^{k}(\tau_1, \ldots, \tau_k, t) = y_R(t-\tau_1) \ldots y_R(t-\tau_k) \quad (17)$$

which comprises the kth power of the reference signal $y_R$.

A digital generator 101 analyses the properties of the reference signal $y_R$ and generates the digital perturbation signal $s_{D,i}$, which is incoherent to the reference signal $y_R$.

The linear parameter estimator 95 uses a LMS algorithm, the reference signal $y_R$ and the error signal e to generate iteratively the linear parameters $P_T$ describing the transfer function $H_T(s)$ required in the linear systems 83, 87, 91 and 93.

The linear parameter estimator 100 determines iteratively the linear parameters $P_{L,i}$ describing the transfer function $H_{L,i}(s)$ required in the linear system 99 by applying an LMS algorithm to the perturbation signal $s_{D,i}$ filtered by the linear system 157 with the parameters $P_{G,i}$ and the error signal e.

A control system 94 generates linear parameters $P_{G,i}$, which modify the transfer function $H_{G,i}(s)$ of the linear systems 78, 156 and 157 in order to separate the lower and higher-order kernels of the homogeneous power systems in (3) and to determine the ADC parameter vector $P_{AD}$ and the DAC parameter vector $P_{DA}$ at higher accuracy.

FIG. 11 shows an embodiment of the parameter estimator 97 according to (14) and (15) which is identical with the parameter estimator 85 according to (16) and (17). A first delay element 105 generates a predefined delay $\tau_1$ in the compensation signal $s'_{D,i}$ provided at input 96. A second delay element 107 generates a predefined delay $\tau_2$ in the reference signal $y'_R$ provided at input 102. The $2^{nd}$-order gradient signal $g_{AD}^2(\tau_1,\tau_2)$ is generated by using a multiplier 115 which combines the delayed signals from the outputs of the first and second delay elements 105 and 107. The LMS estimator 119 generates the second-order kernel function $h_{AD}^2(\tau_1,\tau_2)$ in the ADC parameter vector $P_{AD}$ by using the error signal e and gradient signal $g_{AD}^2(\tau_1,\tau_2)$. The higher-order kernel functions $h_{AD}^k(\tau_1,\ldots,\tau_k)$ with k>2 are estimated in the same way by using additional delay elements 109 and 111, multipliers 113 and 117 and LMS estimators 121 and 123.

The advantage of the invention lies in the generality of the model and of the compensation technique dispensing with detailed information about the physical causes and properties of the nonlinearities in the ADC 17 and all other hardware components. Thus, all ADCs, DACs, filters, amplifier, adders and other transfer elements can be realized with available components at low cost. The identification of the ADC parameter vector $P_{AD}$ and DAC parameter vector $P_{DA}$ in the parameter estimator 49 can be realized by transferring an arbitrary signal like a measurement signal or an ordinary audio signal (music, speech).

The compensation of nonlinear distortion of the ADC and other hardware components can be easily realized by processing digital signals using the identified parameter vectors. The parameter identification may be temporarily disabled if the ADC and the other hardware components are sufficiently time-invariant and do not change with ambient temperature and other influences. Accurate modeling and sufficient distortion compensation required for the particular application can be achieved by selecting the maximum order K of the Volterra series expansion.

The invention claimed is:

1. A converter arrangement for converting an analog input signal $y_A$ into a digital output signal $y_D$, the converter arrangement comprising
   a first input terminal for receiving the analog input signal $y_A$,
   a first analog source, which is configured and arranged to generate based on first control information $P_{P,1}$ a first perturbation signal $s_1$ such that said perturbation signal $s_1$ is incoherent to said analog input signal $y_A$;
   a first linking device, which is configured and arranged to generate based on the first perturbation signal $s_1$ and the analog input signal $y_A$ a perturbed input signal $y'_A$;
   a first ADC having a nonlinear transfer function and which is configured and arranged to generate based on said perturbed input signal $y'_A$ an ADC output signal $y'_D$, whereas the ADC output signal $y'_D$ contains nonlinear ADC distortions $n_{AD}$ produced by the nonlinearity of the ADC;
   a reference signal generator which is arranged and configured to generate a reference signal $y_R$, which is incoherent with said first perturbation signal $s_1$ and which contains signal components that are coherent with the analog input signal $y_A$;
   a parameter estimator, which is configured and arranged to generate based on said ADC output signal $y'_D$ and said reference signal yR, said first control information $P_{P,1}$ and an ADC parameter vector $P_{AD}$, whereas parameter vector $P_{AD}$ describes the nonlinear transfer characteristic of the first ADC; and
   an AD compensation element, which is configured and arranged to generate based on said ADC parameter vector $P_{AD}$ and said ADC output signal $y'_D$ a digital output signal $y_D$ such that the nonlinear ADC distortions $n_{AD}$ of the ADC are reduced in said digital output signal $y_D$; and
   a first output terminal for providing the digital output signal $y_D$.

2. The arrangement of claim 1, where the AD compensation element contains a nonlinear transfer element, which is configured and arranged to generate based on said ADC output signal $y'_D$ and said ADC parameter vector $P_{AD}$ a nonlinear compensation signal $c_{AD}$ such that the nonlinear compensation signal $c_{AD}$ compensates for said nonlinear ADC distortions $n_{AD}$ of the ADC; and
   a second linking device, which is configured and arranged to generate based on said ADC output signal $y'_D$ and said nonlinear compensation signal $c_{AD}$ a linearized output signal $y_c$.

3. The arrangement of claim 1, wherein
   said first analog source contains a first DAC, which is configured and arranged to generate based on a digital perturbation signal $s_{D,1}$ an DAC output signal $s_{A,1}$; and
   said first analog source further contains a linear transfer element, which linear transfer element comprises a transfer function $H_{G,1}(f)$ that is changed by said first control information $P_{P,1}$ wherein said first control information $P_{P,1}$ contains a digital perturbation signal $s_{D,1}$; and which linear transfer element is configured and arranged to generate based on said DAC output signal $s_{A,1}$ a first perturbation signal $s_1$.

4. The arrangement of claim 3, wherein
   said AD compensation element contains at least one linear transfer element, which is configured and arranged to generate based on said first control information $P_{P,1}$ a filtered perturbation signal $s'_{D,1}$, wherein said transfer element models the transfer characteristics of the first analog source and the first ADC; and
   said AD compensation element contains a third linking device, which is configured and arranged to generate based on said filtered perturbation signal $s'_{D,1}$ and said linearized output signal $y_c$ a digital output signal $y_D$ such that said first perturbation signal $s_1$ is reduced.

5. The arrangement of claim 1, comprising
   a digital signal generator for generating a DAC input signal $x'_D$;
   a DAC converting the DAC input signal $x'_D$ into an DAC output signal $x'_A$;
   a second analog source, which is configured and arranged to generate based on second control information $P_{P,2}$ a second perturbation signal $s_2$ such that said second perturbation signal $s_2$ is incoherent to said DAC output signal $x'_A$;
   a fourth linking device, which is configured and arranged to generate based on said second perturbation signal $s_2$ and said DAC output signal $x'_A$ an analog output signal $x_A$; and
   an interface for connecting a device under test to the converter arrangement, wherein in a test/operation mode where the device under test is connected to the converter arrangement the device under test converts said analog output signal $x_A$ into said analog input signal $y_A$.

6. The arrangement of claim 5, wherein
   said DAC is configured to generate nonlinear distortion $n_{DA,0}$ in said DAC output signal $x'_A$;
   said digital signal generator contains a digital signal source for generating an digital input signal $x_D$ with predefined properties; and
   said digital signal generator contains a compensation element, which is configured and arranged to generate based on said digital input signal $x_D$ and said DAC parameter vector $P_{DA}$ a DAC input signal $x'_D$ such that the nonlinear DAC distortions $n_{DA,0}$ of said DAC are compensated.

7. The arrangement of claim 1, wherein
the parameter estimator contains at least one of the following:
- a digital signal source, which is configured and arranged to generate a filtered perturbation signal $s'_{D,i}$, which is coherent with the first perturbation signal $s_1$ of said first analog source;
- an adder, which generates the sum signal $y_t$ by adding said reference signal $y_R$ and said filtered perturbation signal $s'_{D,i}$;
- a nonlinear ADC model, which is configured and arranged to generate based on said sum signal $y_t$ and said ADC parameter vector $P_{AD}$ a model output signal $y_M$, which models the ADC output signal $y'_D$;
- an error assessing element generating based on said model output signal $y_M$ and said ADC output signal $y'_D$ an error signal $e$, which describes the deviation between the nonlinear ADC model and the ADC;
- a gradient device, which is configured and arranged to generate based on said reference signal $y'_R$ and said filtered perturbation signal $s'_{D,i}$, a gradient signal $g^2_{AD}$, wherein said gradient signal $g^2_{AD}$ contains intermodulation distortion generated by the multiplication of said reference signal $y'_R$ and said filtered perturbation signal $s'_{D,i}$; and
- an estimator, which is configured and arranged to generate based on the gradient signal $g^2_{AD}$ said ADC parameter vector $P_{AD}$ by minimizing the error signal $e$.

8. The arrangement of claim 5, wherein
the ADC output signal $y'_D$ is used as the reference signal $y_R$; or
the DAC input signal $x'_D$ is used as the reference signal $y_R$; or
further comprising a reference ADC, which is configured and arranged to generate based on analog input signal $y_A$ the reference signal $y_R$.

9. Measuring device comprising at least one a converter arrangement for converting an analog input signal $y_A$ into a digital output signal $y_D$, the converter arrangement comprising
- a first input terminal for receiving the analog input signal $y_A$;
- a first analog source, which is configured and arranged to generate based on first control information $P_{P,1}$ a first perturbation signal $s_1$ such that said perturbation signal $s_1$ is incoherent to said analog input signal $y_A$;
- a first linking device, which is configured and arranged to generate based on the first perturbation signal $s_1$ and the analog input signal $y_A$ a perturbed input signal $y'_A$;
- a first ADC having a nonlinear transfer function and which is configured and arranged to generate based on said perturbed input signal $y'_A$ an ADC output signal $y'_D$, whereas the ADC output signal $y'_D$ contains nonlinear ADC distortions $n_{AD}$ produced by the nonlinearity of the ADC;
- a reference signal generator is arranged and configured to generate a reference signal $y_R$, which is incoherent with said first perturbation signal $s_1$ and which contains signal components that are coherent with the analog input signal $y_A$;
- a parameter estimator, which is configured and arranged to generate based on said ADC output signal $y'_D$ and said reference signal $y_R$ said first control information $P_{P,1}$ and an ADC parameter vector $P_{AD}$, whereas the parameter vector $P_{AD}$ describes the nonlinear transfer characteristic of the first ADC; and
- an AD compensation element, which is configured and arranged to generate based on said ADC parameter vector $P_{AD}$ and said ADC output signal $y'_D$ a digital output signal $y_D$ such that the nonlinear ADC distortions $n_{AD}$ of the ADC are reduced in said digital output signal $y_D$.
- a first output terminal for providing the digital output signal $y_D$.

10. A method for converting an analog input signal $y_A$ into a digital output signal $y_D$, the method comprising:
- providing an analog input signal $y_A$;
- providing a nonlinear ADC;
- generating first control information $P_{P,1}$ based on said analog input signal $y_A$;
- generating a first perturbation signal $s_1$ based on said first control information $P_{P,1}$ such that the first perturbation signal $s_1$ is incoherent to the analog input signal $y_A$;
- generating a perturbed input signal $y'_A$ based on said first perturbation signal $s_1$ and said analog input signal $y_A$;
- converting said perturbed input signal $y'_A$ into an ADC output signal $y'_D$ such that said ADC output signal $y'_D$ contains nonlinear ADC distortions $n_{AD}$ produced by a nonlinearity of the ADC;
- providing a reference signal $y_R$, which is incoherent with the first perturbation signal $s_1$ and which is coherent with the analog input $y_A$;
- generating an ADC parameter vector $P_{AD}$ and said first control information $P_{P,1}$ based on said ADC output signal $y'_D$ and said reference signal $y_R$ such that said ADC parameter vector $P_{AD}$ describes the generation of the nonlinear ADC distortions $n_{AD}$ in the ADC; and
- generating an digital output signal $y_D$ based on said ADC output signal $y'_D$ and said ADC parameter vector $P_{AD}$ such that said nonlinear ADC distortions $n_{AD}$ are reduced in the output signal $y_D$.

11. The method of claim 10, wherein generating said digital output signal $y_D$ contains at least one of:
- generating a nonlinear compensation signal $c_{AD}$ based on said ADC output signal $y'_D$ and said ADC parameter vector $P_{AD}$ such that said nonlinear compensation signal $c_{AD}$ compensates for said nonlinear ADC distortions $n_{AD}$ of the ADC; and
- generating a linearized output signal $y_c$ based on said ADC output signal $y'_D$ and said nonlinear compensation signal $c_{AD}$.

12. The method of claim 10, wherein generating said first perturbation signal $s_1$ contains at least one of:
- generating a digital perturbation signal $s_{D,1}$ in said first control information $P_{P,1}$;
- converting said digital perturbation signal $s_{D,1}$ into an analog DAC output signal $s_{A,1}$; and
- generating a first perturbation signal $s_1$ by linear filtering said DAC output signal $s_{A,1}$ with the transfer function $H_{G,1}(f)$ defined by said first control information $P_{P,1}$.

13. The method of claim 12, wherein generating said digital output signal $y_D$ contains at least one of:
- generating a filtered perturbation signal $s'_{D,1}$ by filtering said digital perturbation signal $s_{D,1}$ with a linear transfer function, which describes the transfer of the digital perturbation signal $s_{D,1}$ to said ADC output signal $y'_D$; and
- generating a digital output signal $y_D$ by combining said filtered perturbation signal $s'_{D,1}$ with said linearized output signal $y_c$, wherein said filtered perturbation signal $s'_{D,1}$ compensates for said first perturbation signal $s_1$.

14. The method of claim 10, further comprising at least one of:
  generating a DAC input signal $x'_D$;
  converting said DAC input signal $x'_D$ into an DAC output signal $x'_A$;
  generating an analog output signal $x_A$ based on said DAC output signal $x'_A$;
  supplying said analog output signal $x_A$ to an input of a device under test; and
  generating said analog input signal $y_A$ by measuring a state variable of the device under test.

15. The method of claim 14, where generating said analog output signal $x_A$ contains at least one of:
  generating a second perturbation signal $s_2$ based on said second control information $P_{P,2}$, wherein said second perturbation signal $s_2$ is incoherent to said DAC output signal $x'_A$; and
  generating said analogue output signal $x_A$ by combining said second perturbation signal $s_2$ with the DAC output signal $x'_A$.

16. The method of claim 14, wherein generation of said DAC input signal $x'_D$ contains at least one of:
  providing a digital input signal $x_D$;
  generating a DAC compensation signal $c_{DA}$ based on said digital input signal $X_D$ by
  using said DAC parameter vector $P_{DA}$, wherein said DAC compensation signal $c_{DA}$ models said nonlinear DAC distortions $n_{DA,0}$ generated by converting said DAC input signal $x'_D$ into an DAC output signal $x'_A$;
  generating a DAC input signal $x'_D$ based on said DAC compensation signal $c_{DA}$ and said digital signal $X_D$, wherein said DAC compensation signal $c_{DA}$ compensates said nonlinear DAC distortions $n_{DA,0}$ generated in said DAC output signal $x'_A$.

17. The method of claim 10, wherein generating an ADC parameter vector $P_{AD}$ contains at least one of:
  generating a filtered perturbation signal $s'_{D,1}$ based on said digital perturbation signal $s_{D,1}$, wherein said filtered perturbation signal $s'_{D,1}$ is coherent with the first perturbation signal $s_1$;
  generating a sum signal $y_t$ based on said reference signal $y_R$ and said filtered perturbation signal $s'_{D,1}$;
  generating a model output signal $y_M$ approximating said ADC output signal $y'_D$ based on said sum signal $y_t$ and said ADC parameter vector $P_{AD}$;
  generating an error signal e based on said model output signal $y_M$ and said ADC output signal y'D, wherein said error signal e describes the deviation of the model output signal $_{yM}$ from the ADC output signal $y'_D$;
  generating a gradient signal $g^2_{AD}$ based on said reference signal $y_R$ and said filtered perturbation signal $s'_{D,1}$, wherein the gradient signal $g^2_{AD}$ contains nonlinear intermodulation distortion generated by said reference signal $-y_R$ and said filtered perturbation signal $s'_{D,1}$; and
  estimating the ADC parameter vector $P_{AD}$ based on said gradient signal $g^2_{AD}$ by minimizing the error signal e.

18. The method of claim 14, further comprising:
  generating said reference signal $y_R$ based on said ADC output signal $y'_D$ or based on said DAC input signal $x'_D$ or based said analog input signal $y_A$.

* * * * *